United States Patent
Wang et al.

(10) Patent No.: US 10,099,218 B2
(45) Date of Patent: Oct. 16, 2018

(54) METHOD FOR MANUFACTURING AND/OR PACKAGING A CHIP

(71) Applicant: CapitalBio Corporation, Beijing (CN)

(72) Inventors: Lei Wang, Beijing (CN); Xinying Zhou, Beijing (CN); Li Ma, Beijing (CN); Juan Xin, Beijing (CN); Mingxian Lin, Beijing (CN); Jinhai Feng, Beijing (CN)

(73) Assignee: CAPITALBIO CORPORATION, Beijing (CN)

( * ) Notice: Subject to any disclaimer, the term of this patent is extended or adjusted under 35 U.S.C. 154(b) by 13 days.

(21) Appl. No.: 15/356,461

(22) Filed: Nov. 18, 2016

(65) Prior Publication Data

US 2017/0144150 A1    May 25, 2017

(30) Foreign Application Priority Data

Nov. 19, 2015    (CN) .......................... 2015 1 0802514

(51) Int. Cl.
*B01L 3/00* (2006.01)
*B81C 3/00* (2006.01)

(52) U.S. Cl.
CPC ........ *B01L 3/502707* (2013.01); *B81C 3/001* (2013.01); *B01L 2200/12* (2013.01); *B01L 2300/0803* (2013.01); *B01L 2300/0816* (2013.01); *B01L 2300/0887* (2013.01)

(58) Field of Classification Search
None
See application file for complete search history.

(56) References Cited

U.S. PATENT DOCUMENTS

| | | | | |
|---|---|---|---|---|
| 2002/0001670 A1* | 1/2002 | Pauw | .................... | H01L 21/288 438/113 |
| 2005/0012197 A1* | 1/2005 | Smith | .................. | B81B 7/0061 257/687 |
| 2011/0045262 A1 | 2/2011 | Maruno et al. | | |
| 2011/0269131 A1 | 11/2011 | Chiu et al. | | |
| 2013/0061961 A1 | 3/2013 | Rapp | | |

FOREIGN PATENT DOCUMENTS

| | | | | |
|---|---|---|---|---|
| CN | 1480724 | | 3/2004 | |
| CN | 1557967 | | 12/2004 | |
| CN | 101562141 | | 10/2009 | |
| CN | 102092669 | | 6/2011 | |
| CN | 102272592 | | 12/2011 | |
| CN | 102950700 | * | 3/2013 | ............ B29C 45/17 |

(Continued)

OTHER PUBLICATIONS

Notice of First Examination for CN 201510802514.3, dated Sep. 26, 2016, 9 pages (Including English translation).

(Continued)

*Primary Examiner* — Reema Patel
(74) *Attorney, Agent, or Firm* — Rimon P.C.

(57) ABSTRACT

In one aspect, disclosed herein are methods for packaging biochips, including microfluidic chips. The method can comprise bonding a substrate and a cover slide, packaging the bonded chip, creating a vacuum in the package, and applying a pressure on the packaged chip. The method is particularly useful for minimizing bubble formation during low-cost and mass production of microfluidic chips.

21 Claims, 2 Drawing Sheets

(56) References Cited

FOREIGN PATENT DOCUMENTS

| CN | 103041876 | | 4/2013 | |
|---|---|---|---|---|
| CN | 103055981 | | 4/2013 | |
| CN | 103264502 | | 8/2013 | |
| CN | 103357453 | | 10/2013 | |
| CN | 103818876 | | 5/2014 | |
| CN | 20141270430 | * | 2/2016 | ............. H01L 21/50 |

OTHER PUBLICATIONS

Notice of Second Examination for CN 201510802514.3, dated Apr. 7, 2017, 7 pages (Including English translation).

* cited by examiner

FIG. 4C

METHOD FOR MANUFACTURING AND/OR PACKAGING A CHIP

CROSS-REFERENCE TO RELATED APPLICATIONS

This application claims priority to Chinese Patent Application No. 201510802514.3, filed on Nov. 19, 2015, the content of which is incorporated by reference herein in its entirety for all purposes.

TECHNICAL FIELD

The present disclosure relates to the field of manufacturing and packaging, for example, a chip such as a biochip and a microfluidic chip. In particular aspects, the present disclosure relates to a method for manufacturing and/or packaging a chip for a Micro Total Analysis System (μ-TAS).

BACKGROUND

As a high-speed, efficient, and energy-saving micro total analysis system (μ-TAS), a microfluidic chip is capable of carrying microstructures and other functional units like micro-channels, micro pumps, micro valves, and liquid accumulator (or reservoir) etc. on a substrate of several square centimeters. A microfluidic chip can be made by micromachining, precise injection molding, traditional machining and so on, thus integrating sample preparation, sample injection, reaction, separation, and/or testing of micro volume samples.

Some currently available methods for manufacturing and/or packing microfluidic chips use organic reagents that may have an adverse effect on the biochemical reagent pre-stored in the micro channels. In addition, residual chemicals may retrain, interfere, or inhibit biochemical reactions in the chip. In addition, the production cycle of a single chip takes a long time, rendering the methods unsuitable for mass production.

Other methods apply an ultraviolet curing agent to the surface of a chip through a centrifugal force. It is, however, difficult to avoid the blockage in shallower micro channels. Moreover, the surface of a chip requires a very high level of smoothness, and in the process of applying the curing and bonding agents, it is very difficult to apply those agents evenly. Still other methods use laser bonding, and the high heat generated in the process may destroy and deactivate the biological sample embedded in the chip.

The above-mentioned chip packaging methods, whether the chip surface treatment combined with hot pressing, or the UV curing agent adhesion, or laser bonding, are unfavorable because the auxiliary instruments and devices involved are complicated and expensive. In addition, the fabrication of chips is complicated too with a long production cycle and is difficult for industrialized production. Moreover, the organic solvent applied may restrain the biochemical reaction on the chip. Therefore, there is a need for an improved method of manufacturing and/or packaging chips. The present disclosure addresses this and related needs.

SUMMARY

The summary is not intended to be used to limit the scope of the claimed subject matter. Other features, details, utilities, and advantages of the claimed subject matter will be apparent from the detailed description including those aspects disclosed in the accompanying drawings and in the appended claims.

In one aspect, disclosed herein is a method of manufacturing a packaged chip, comprising aligning a first layer and a second layer to obtain an assembly of the first and second layers.

In any of the preceding embodiments, an adhesive interface can be provided between the first and second layers, which can be a substrate and a cover sheet for the chip, respectively.

In any of the preceding embodiments, the method can further comprise placing the assembly in a package.

In any of the preceding embodiments, the method can further comprise removing air or gas from the package, for example, the sealed package with the assembly in it.

In any of the preceding embodiments, the method can further comprise applying a pressure on the packaged assembly.

In any of the preceding embodiments, the method can further comprise treating the packaged assembly to bond the first the second layers into a chip. The treatment can be done before or after the assembly is placed in the package.

In any of the preceding embodiments, a packaged chip can be obtained.

In any of the preceding embodiments, the method can comprise applying a pressure on the packaged assembly to bond the first the second layers into a chip, and/or optionally treating the packaged assembly, thereby obtaining a packaged chip.

In any of the preceding embodiments, the chip can be a biochip and/or a microfluidic chip.

In any of the preceding embodiments, the first layer can be a substrate of the chip and the second layer can be a cover of the chip.

In any of the preceding embodiments, the adhesive interface can comprise a double-sided adhesive material, such as a sheet or layer.

In any of the preceding embodiments, the first layer can be a substrate of the chip and the second layer can comprise an adhesive surface facing and/or contacting the substrate.

In any of the preceding embodiments, the air or gas in the package can be removed to create a vacuum in the package.

In any of the preceding embodiments, at least about 70%, at least about 80%, at least about 90%, at least about 95%, at least about 99%, at least about 99.9%, or at least about 99.99% of air or gas in the package can be removed.

In any of the preceding embodiments, after the air or gas removal, there can be less than about 10% (v/v), less than about 5% (v/v), less than about 1% (v/v), less than about 0.1% (v/v), less than about 0.01% (v/v), or less than about 0.001% (v/v) of air or gas left in the packaged volume.

In any of the preceding embodiments, the treatment of the packaged assembly can comprise heating.

In any of the preceding embodiments, the treatment of the packaged assembly can comprise exposing the packaged assembly to a light.

In any of the preceding embodiments, the light can comprise a UV light.

In any of the preceding embodiments, the adhesive interface can comprise a pressure sensitive adhesive material, a temperature sensitive adhesive material, and/or a light sensitive adhesive material.

In any of the preceding embodiments, the pressure can be applied on the packaged assembly at the same time as treating the packaged assembly.

In any of the preceding embodiments, the pressure can be applied prior to the treatment of the packaged assembly.

In any of the preceding embodiments, the first layer, the second layer, and/or the packaging can comprise a material selected from the group consisting of a resin, a plastic, a silicone rubber, a glass, a ceramic, silicon, a metal, and any combination thereof.

In any of the preceding embodiments, the first layer, the second layer, and/or the packaging can comprise a transparent material, a semi-transparent material, and/or a non-transparent material.

In any of the preceding embodiments, the packaging can comprises a plastic and/or an aluminum foil.

In any of the preceding embodiments, one or more steps of the method can be automated or manually performed.

In any of the preceding embodiments, the shape of the first and the second layers of the chip can be the same or different.

In any of the preceding embodiments, the shape of the first and the second layers of the chip can be round, rectangular, annular, or fan-shaped.

In any of the preceding embodiments, the chip can comprise at least two first layers and/or at least two second layers.

In any of the preceding embodiments, the chip can comprise two first layers and one second layers, and the second layer has two surfaces each contacting one of the first layers via a double-sided adhesive sheet.

In any of the preceding embodiments, the method can further comprise handling, shipping, or storing the packaged chip without the need of cleaning or sterilizing the chip.

In another aspect, provided herein is a chip produced by any of the method disclosed herein.

In another aspect, provided herein is a packaged chip produced by a method according to any of the preceding embodiments.

BRIEF DESCRIPTION OF THE DRAWINGS

In order to more clearly illustrate the embodiments of the present disclosure, the drawings are briefly described below. It is apparent that the drawings in the following description are embodiments of the present disclosure, and other drawings may be obtained based on the present disclosure by a person with ordinary skill in the technical field without creative effort.

FIGS. 1A-C are schematic diagrams showing a first slice coated with a double-sided adhesive is bonded with a second slice, according to certain aspects of the present disclosure. In FIG. 1A, the double-sided adhesive is sensitive to pressure. In FIG. 1B, the double-sided adhesive is sensitive to light such as ultraviolet (UV) light. In FIG. 1C, the double-sided adhesive is sensitive to temperature.

FIGS. 3A-C show an exemplary method for packaging multiple layers, according to one aspect of the present disclosure. FIG. 3B is a top view of the multiple layers of the chip, while

DETAILED DESCRIPTION

A detailed description of one or more embodiments of the claimed subject matter is provided below along with accompanying figures that illustrate the principles of the claimed subject matter. The claimed subject matter is described in connection with such embodiments, but is not limited to any particular embodiment. It is to be understood that the claimed subject matter may be embodied in various forms, and encompasses numerous alternatives, modifications and equivalents. Therefore, specific details disclosed herein are not to be interpreted as limiting, but rather as a basis for the claims and as a representative basis for teaching one skilled in the art to employ the claimed subject matter in virtually any appropriately detailed system, structure, or manner. Numerous specific details are set forth in the following description in order to provide a thorough understanding of the present disclosure. These details are provided for the purpose of example and the claimed subject matter may be practiced according to the claims without some or all of these specific details. It is to be understood that other embodiments can be used and structural changes can be made without departing from the scope of the claimed subject matter. It should be understood that the various features and functionality described in one or more of the individual embodiments are not limited in their applicability to the particular embodiment with which they are described. They instead can, be applied, alone or in some combination, to one or more of the other embodiments of the disclosure, whether or not such embodiments are described, and whether or not such features are presented as being a part of a described embodiment. For the purpose of clarity, technical material that is known in the technical fields related to the claimed subject matter has not been described in detail so that the claimed subject matter is not unnecessarily obscured.

Unless defined otherwise, all terms of art, notations and other technical and scientific terms or terminology used herein are intended to have the same meaning as is commonly understood by one of ordinary skill in the art to which the claimed subject matter pertains. In some cases, terms with commonly understood meanings are defined herein for clarity and/or for ready reference, and the inclusion of such definitions herein should not necessarily be construed to represent a substantial difference over what is generally understood in the art. Many of the techniques and procedures described or referenced herein are well understood and commonly employed using conventional methodology by those skilled in the art.

All publications referred to in this application are incorporated by reference in their entireties for all purposes to the same extent as if each individual publication were individually incorporated by reference.

All headings are for the convenience of the reader and should not be used to limit the meaning of the text that follows the heading, unless so specified.

Definitions

As used herein and in the appended claims, the singular forms "a," "an," and "the" include plural referents unless the context clearly dictates otherwise. For example, "a" or "an" means "at least one" or "one or more." Thus, reference to "a chip" refers to one or more chips, and reference to "the method" includes reference to equivalent steps and methods disclosed herein and/or known to those skilled in the art, and so forth.

Throughout this disclosure, various aspects of the claimed subject matter are presented in a range format. It should be understood that the description in range format is merely for convenience and brevity and should not be construed as an inflexible limitation on the scope of the claimed subject matter. Accordingly, the description of a range should be considered to have specifically disclosed all the possible sub-ranges as well as individual numerical values within that range. For example, where a range of values is provided, it is understood that each intervening value, between the upper and lower limit of that range and any other stated or intervening value in that stated range is encompassed within the claimed subject matter. The upper and lower limits of these smaller ranges may independently be included in the smaller ranges, and are also encompassed within the claimed subject matter, subject to any specifically excluded limit in the stated range. Where the stated range includes one or both of the limits, ranges excluding either or both of those included limits are also included in the claimed subject matter. This applies regardless of the breadth of the range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6.

It is understood that aspects and embodiments of the disclosure described herein include "consisting" and/or "consisting essentially of" aspects and embodiments. The terms "comprising", "including" and "having" are intended to be inclusive and mean that there may be additional elements other than the listed elements.

The term "and/or" when used in a list of two or more items, means that any one of the listed items can be employed by itself or in combination with any one or more of the listed items. For example, the expression "A and/or B" is intended to mean either or both of A and B, i.e. A alone, B alone or A and B in combination. The expression "A, B and/or C" is intended to mean A alone, B alone, C alone, A and B in combination, A and C in combination, B and C in combination or A, B, and C in combination.

As used herein, the term "microfluidic device" generally refers to a device through which materials, particularly fluid borne materials, such as liquids, can be transported, in some embodiments on a micro-scale, and in some embodiments on a nanoscale. Thus, the microfluidic devices described by the presently disclosed subject matter can comprise microscale features, nanoscale features, and combinations thereof. A microfluidic device can include a microfluidic valve, a microfluidic chip, a microfluidic system, etc.

Accordingly, an exemplary microfluidic device typically comprises structural or functional features dimensioned on the order of a millimeter-scale or less, which are capable of manipulating a fluid at a flow rate on the order of a μL/min or less. Typically, such features include, but are not limited to channels, fluid reservoirs, reaction chambers, mixing chambers, and separation regions. In some examples, the channels include at least one cross-sectional dimension that is in a range of from about 0.1 μm to about 500 μm. The use of dimensions on this order allows the incorporation of a greater number of channels in a smaller area, and utilizes smaller volumes of fluids.

A microfluidic device can exist alone or can be a part of a microfluidic system which, for example and without limitation, can include: pumps for introducing fluids, e.g., samples, reagents, buffers and the like, into the system and/or through the system; detection equipment or systems; data storage systems; and control systems for controlling fluid transport and/or direction within the device, monitoring and controlling environmental conditions to which fluids in the device are subjected, e.g., temperature, current, and the like.

As used herein, the terms "channel," "micro-channel," "fluidic channel," and "microfluidic channel" are used interchangeably and can mean a recess or cavity formed in a material by imparting a pattern from a patterned substrate into a material or by any suitable material removing technique, or can mean a recess or cavity in combination with any suitable fluid-conducting structure mounted in the recess or cavity, such as a tube, capillary, or the like. In the present disclosure, channel size means the cross-sectional area of the microfluidic channel. A microfluidic channel can include a channel in a microfluidic device in which a material, such as a fluid, e.g., a gas or a liquid, can flow through. A microfluidic channel can include a channel in which a material of interest, e.g., a solvent or a chemical reagent, can flow through. Further, the term "control channel" refers to a flow channel in which a material, such as a fluid, e.g., a gas or a liquid, can flow through in such a way to actuate a valve or pump.

As used herein, "chip" refers to a solid substrate with a plurality of one-, two- or three-dimensional micro structures or micro-scale structures on which certain processes, such as physical, chemical, biological, biophysical or biochemical processes, etc., can be carried out. The micro structures or micro-scale structures such as, channels and wells, electrode elements, electromagnetic elements, are incorporated into, fabricated on or otherwise attached to the substrate for facilitating physical, biophysical, biological, biochemical, chemical reactions or processes on the chip. The chip may be thin in one dimension and may have various shapes in other dimensions, for example, a rectangle, a circle, an ellipse, or other irregular shapes. The size of the major surface of chips of the present disclosure can vary considerably, e.g., from about 1 mm$^2$ to about 0.25 m$^2$. Preferably, the size of the chips is from about 4 mm$^2$ to about 25 cm$^2$ with a characteristic dimension from about 1 mm to about 5 cm. The chip surfaces may be flat, or not flat. The chips with non-flat surfaces may include channels or wells fabricated on the surfaces.

As used herein, a "sample" can be a solution, a suspension, liquid, powder, a paste, aqueous, non-aqueous or any combination thereof. A biological sample of the present disclosure encompasses a sample in the form of a solution, a suspension, a liquid, a powder, a paste, an aqueous sample, or a non-aqueous sample. As used herein, a "biological sample" includes any sample obtained from a living or viral (or prion) source or other source of macromolecules and biomolecules, and includes any cell type or tissue of a subject from which nucleic acid, protein and/or other macromolecule can be obtained. The biological sample can be a sample obtained directly from a biological source or a sample that is processed. For example, isolated nucleic acids that are amplified constitute a biological sample. Biological samples include, but are not limited to, body fluids, such as blood, plasma, serum, cerebrospinal fluid, synovial fluid, urine and sweat, tissue and organ samples from animals and plants and processed samples derived therefrom.

Methods for Manufacturing and/or Packaging Chips

Microfluidic chip is a hotspot in the development of Micro Total Analysis Systems (μ-TAS). The microfluidic chip technology uses the microfluidic chip as an operating platform, in combination with biological, chemical, and/or drug screening technologies. Typically, the platform is capable of completing the majority of steps in a whole analytical process, including reagent loading, separation, reaction, and/or detection. In recent years, with the rapid development of bio-chip technology, microfluidic chips play more and more important roles in the area of life science, analytical chemistry, and medicine.

A microfluidic chip fabricated by microfluidic technology is a chip containing micro-sized channels. In the microfluidic chip, a small amount of fluid flows through microchannels to make various reactions, which makes it possible to integrate the multiple, complicated laboratory processes on a single chip. Accordingly, it is also called as Lab-on-a-Chip (LOC). As a material for fabricating micro-channels, various materials can be used, such as glass, silica, polycarbonate, and poly(methylmethacrylate), poly(dimethylsiloxane) (PDMS). In other aspects, a nanofluidic chip containing nano-sized channels may also be used to allow even single molecule detection.

In CN102092669A, a packaging method for microfluidic chips is disclosed. The method combines hot pressing with surface treatment. It applies organic reagents such as chloroform, dichloroethane, cyclonexane, normal hexane, and ethyl acetate, etc. to treat the surface of a cover slice and a substrate of organic material. Then, the micro melted substance on the surface is dried by airing. Finally, hot pressing by using an ordinary pneumatic hot press is used to package the chips.

In CN103264502A, a method for adhesion and bonding of rigid-polymer microfluidic chips is disclosed. The method uses a metal block for hot pressing and adhesion of two layers of chips. Among them, there are adhesion strips around the microfluidic structure of one layer of chips while the other layer of chips is spin-coated with an acetone solvent.

The above-mentioned methods can not only prevent the micro channels from deformation and blockage, but also improve the rate of finished products. However, in these two methods, the organic reagents may have an adverse effect on the biochemical reagent pre-loaded or embedded in the micro channels. In addition, the residual chemicals may restrain, interfere, or inhibit one or more biochemical reactions in the packaged chip. Furthermore, the production cycle of a single chip often takes a long time, and mass production is not easy.

CN1557967A discloses a packaging method for bonding of plastic microfluidic chips based on an ultraviolet curing agent. The natural affinity between dimethyl silicone polymer and plastics is employed to bond two plastic chips, and then an ultraviolet curing and bonding agent is applied to bond the other two plastic chips. This method results in the permanent packaging of plastic microfluidic chips with a three-layer structure is realized, in order to overcome the issues of deformation and blockage of micro channels caused by the thermal packaging method. However, the shape of a chip is limited because this packaging method applies the ultraviolet curing agent to the surface of chip through centrifugal force. In addition, it is difficult to avoid the blockage in shallower micro channels. Moreover, a very high smoothness on the surface of a chip is typically required and the process of applying the curing and bonding agent is hard to control to make sure an even surface is produced.

CN 1480724A discloses a method and device for packaging polymer microfluidic chips based on laser bonding. A laser beam capable of penetrating from the transparent plastic layer to the bonding position is employed to melt together the chip material layer to be bonded, and thus form a melted bonding area and achieve a close packaging. In this method, it is easy to control and provide a high bonding speed and reliability, but the laser bonding device is complicated and expensive. What is more, at least one of the two bonded components needs to be transparent to laser wavelength. If the two components are transparent to laser wavelength, the bonding position of the two components shall be coated or filled with a layer of absorption film which may, to a great extent, affect the biological activity in biochemical and medical test reaction and result in the failure of experiment. In addition, the high heat generated in the process of laser bonding may destroy and/or deactivate the biological sample embedded in the chip, which is a bottleneck in the field of biochemical tests.

In one aspect, disclosed herein is a method for packaging one or more chips, such as a microfluidic chip. In one aspect, a double-sided or single-sided adhesive is applied to bond together a substrate and a cover slice, in order to form a microfluidic chip. In another aspect, the method further comprises placing the bonded chip in a package, such as a bag, and vacuuming the package or otherwise removing the air or gas in the package. In one aspect, the method further comprises pressing the substrate and the cover slice bonded by the adhesive, so as to prevent the bonded interfaces from becoming unstable and/or to prevent air bubbles from forming between the interfaces and/or on the surface of the chip.

The problems of unstable bonding and bubble formation exist in the conventional solid double-sided adhesive bonding method. In one aspect, the presently disclosed method overcomes or reduces the problem of unstable bonding between the interfaces. In another aspect, the presently disclosed method overcomes or reduces the problem of air or gas bubble formation between the interfaces and/or on the surface of the chip.

In one aspect, the presently disclosed method is capable of avoiding deformation of the chip and/or blockage of micro-channels in the process of bonding the microfluidic chip. In one aspect, a solution to the external packaging of the chip is also provided by placing the chip in a bag and vacuuming the bag which will then wrap around the chip.

In one aspect, the presently disclosed method does not require complicated and expensive auxiliary equipment. In another aspect, the fabrication process is simple and effective, ensuring a high fidelity of micro-channel formation on the chip and a high strength bonding between layers of the manufactured and/or packaged chip. In another aspect, the presently disclosed method is especially suitable for low-cost and mass production of microfluidic chips.

In one aspect, provided herein is a method for making and/or packaging a chip, such as a microfluidic chip. In any of the proceeding embodiments, the method can further comprise providing an external packaging of the chip. In some embodiments, bonding of the at least two layers of a chip and provision of the external packaging of the bonded chip are performed in one integrated process. In one aspect, provided herein is a method of making a fully bonded chip, e.g., a finished chip product based on double-sided or single-sided adhesives (e.g., a solid double-sided or single-sided adhesive), within an external packaging. In one aspect, the fully bonded and fully packaged chip product is produced without the need of separately making a fully bonded chip and then packaging the fully bonded chip. In one aspect, after bonding the chip layers with a double-sided or single-sided adhesive, the presently disclosed method further comprises providing a vacuum around the bonded layers (which may not have been fully bonded), for example, by placing the bonded layers in a bag and vacuuming the bag. Thus, in one aspect, the presently disclosed method not only prevents the bonded layers from becoming unstable (e.g., by applying a pressure on the layers), but also at the same time prevents or reduces bubble formation between the chip layers (e.g., by contacting and then pressing the layers in a vacuum created in a packaging external to the chip) and solves the problem of storing the chip product, e.g., for a short-term storage, for storage during shipping, and/or for a long-term storage.

In one aspect, the present disclosure uses a simple packaging process in order to achieve a high strength of bonding between layers of a chip, and/or a high fidelity of the microstructures in or on the chip (e.g., one or more micro-channels, micro-wells, micro-columns, micro-valves, etc.). In one aspect, the fidelity of the microstructures means that the actual shape and dimensions of the microstructures in or on the manufactured chip are within less than about 0.01%, less than about 0.1%, less than about 0.5%, less than about 1%, less than about 2%, or less than about 5% deviation from the shape or dimensions as designed. For example, in one embodiment, the difference between the actual width of a micro-channel in a chip and the designed width is less than about 0.01%, less than about 0.1%, less than about 0.5%, less than about 1%, less than about 2%, or less than about 5% of the designed width of the micro-channel. In one aspect, this is due to the reduction or elimination of bubbles between the chip layers that form the micro-channel, because if a bubble is formed on the path of the micro-channel, the width, depth, or length of the actual micro-channel may be significantly changed compared to the dimensions as designed.

In a further aspect, because the chip layers to be bonded are packaged before the pressing step (e.g., packaged in an external packaging that can be directly handled, shipped, and/or stored without the need for further cleaning or sterilization), the pressing step can be performed in a normal production workshop. In one aspect, the production line of a chip (e.g., a chip comprising micro-channels) can be transferred from a clean room to a normal production workshop through a sealing or packaging process before pressing the chip layers to permanently bond the layers. In one aspect, the method disclosed herein greatly saves the cost and shortens the production cycle, and realizes low-cost and mass production of a chip such as microfluidic chips.

In one aspect, the presently disclosed method overcomes disadvantages of the art methods by applying a pressure to two or more layers to be bonded in a chip in an environment that is substantially free of any air or gas, such as a vacuum created by vacuuming a package containing the layers to be bonded. In one aspect, the chip layer or layers have an adhesive on the surface for bonding with one or more other layers. In particular embodiments, the adhesive is a solid-state adhesive. The solid adhesive can be introduced onto the layer(s) either before or during the processing of aligning the layers or aligning the layer with a slice. Then, the solid adhesive can be subjected to a temperature process in order melt the adhesive. Such temperature process might be provided by or comprise heating, irradiation of electro-magnetic waves, etc. In one aspect, the solid adhesive comprises a solid adhesive thin film. In one aspect, the solid double-sided or single-sided adhesive and vacuum pumping and pressurizing method is employed to bond two or more slices closely, and at the same time complete the external packaging of the finished microfluidic chip.

In one aspect, provided herein is a method comprising: (1) aligning a substrate and a cover slice, wherein a double-sided adhesive is provided between the substrate and the cover slice, for example, the adhesive can be on a surface of the substrate and/or a surface of the cover slice; or providing a single-sided adhesive layer on a surface of the substrate with the adhesive side facing the surface of the substrate while the other side of the adhesive layer is non-adhesive (e.g., the substrate can be sealed by the single-sided adhesive layer); (2) placing the assembly of the substrate/cover slice or substrate/adhesive layer of step (1) in a package such as a plastic bag, and providing a substantially vacuum environment for the assembly, for example, by removing air or gas from the sealed package using a vacuum; and (3) applying a pressure, light, or heating to the packaged assembly form step (2) in order to bond the chip. In some aspects, the chip is permanently bonded in step (3) and an external package is provided for direct handling without the need for further cleaning or sterilization, for shipping, and/or for short-term or long-term storage.

In any of the preceding embodiments, the chip can be a microfluidic chip. In any of the preceding embodiments, the chip substrate and/or cover slice can comprise any one or more of the materials selected from the group consisting of a resin (natural or synthetic), a plastic, a silicone rubber, a glass, a ceramic, silicon, silicon oxide, and a metal. In any of the preceding embodiments, the plastic can comprise any one or more of the materials selected from the group consisting of poly(methyl methacrylate) (PMMA), polycarbonate (PC), polypropylene (PP), cyclic olefin copolymer (COC), polyethylene terephthalate (PET), cyclo-olefin polymers (COP), and polydimethylsiloxane (PDMS). In view of the chip's intended use, processing characteristics, and cost of manufacture and use, plastics like PC, PMMA, COP, PET, COC, and PP may be used.

In any of the preceding embodiments, a microfluidic chip may comprise a glass, a metal, a silicon wafer, and/or a polymer, or a combination thereof. In some embodiments, polymers such as dimethyl silicone polymer (PDMS), polymethyl methacrylate (PMMA), polycarbonate (PC), and other plastics are used, for example, for making the substrate and/or cover slice, because of their relatively low price, amenability to shaping, and low cost in batch production. In one aspect, the material should be compatible with the manufacturing and/or packaging of a chip such as microfluidic chips. For example, for mass production of microfluidic chip, yield of chips and production efficiency are important.

In any of the preceding embodiments, the double-sided and/or single-sided adhesive can comprises a stick material and/or a viscous material. In any of the preceding embodiments, the adhesive used herein can comprise a material that is sensitive to pressure, temperature, irradiation, and/or light. In any of the preceding embodiments, the adhesive used herein can comprise a transparent, semi-transparent, and/or non-transparent material.

In any of the preceding embodiments, the adhesive used herein can be a solid adhesive material. In one aspect, unlike a liquid adhesive which may contain bubbles trapped therein, a solid adhesive is substantially free of gas trapped therein, either before or after the pressing step to permanently bond the layers to form a chip. In some embodiments, substantially free of gas means the volume of gas in the adhesive is less than about 0.0001%, less than about 0.001%, less than about 0.01%, less than about 0.1%, less than about 1%, or less than about 5% of the total volume of the adhesive.

In any of the preceding embodiments, the adhesive such as the solid adhesive can be made of a thermosetting and/or a thermoplastic adhesive, for example, a thermosetting adhesive selected from the group consisting of cyanoacrylates, polyester, urea-formaldehyde, melamine-formaldehyde, resorcinol, rescorsinol-phenol-formaldehyde, epoxy, polyimide, polybenzimidazole, acrylics, and acrylic acid diester compounds, or any combination thereof, or a thermoplastic adhesive selected from the group consisting of cellulose nitrate, cellulose acetate, polyvinyl acetate, polyvinyl chloride, polyvinyl acetals, polyvinyl alcohols, polyimides, polyamides, acrylics, and phenoxy compounds, or any combination thereof.

Thermosetting adhesives can be cured either at room temperature or at elevated temperatures. In some embodiments, suitable thermosetting adhesives can be either single or double-component systems. Once cured, thermosetting adhesives by nature form densely cross-linked structures. As a result, they display excellent chemical resistance to heat and solvents, and undergo little elastic deformation under load at elevated temperatures. Typically, thermosetting adhesive bonds are capable of withstanding temperatures of approximately 90° C. to 260° C.

Thermoplastic adhesives typically do not form cross-links during cure and can be melted without undergoing a significant change in adhesive property. Typically, thermoplastic adhesives are single-component systems that, once melted, harden upon cooling or by evaporation of a solvent. In some embodiments, illustrative examples of suitable thermosetting solid adhesives include EPON™ 1001F, R1500 from Rogers, and Scotch-Weld™ structural adhesive film AF 191 from 3M™. EPON™ Resin 1001F is a low molecular weight solid epoxy resin derived from a liquid epoxy resin and bisphenol-A. With different types of curing agents, EPON™ Resin 1001 F can be cured throughout a temperature range of approximately 100° C. to 200° C. R1500 from Rogers is a cross-linkable acrylic film that can be cured at 190° C. for 70 minutes at a pressure of about 100 psi. SCOTCH-WELD™ structural adhesive film AF 191 from 3M™ is a thermosetting, modified epoxy film that can be crosslinked at 350° F. for one hour.

In some embodiments, one example of a suitable thermoplastic solid adhesive can be DuPont ELJ-100, a thermoplastic polyimide (TPI). This film is capable of being bonded at 250° C. for 90 minutes under a pressure of 200 psi. A further advantage of this film is that it can withstand temperatures of up to 200° C. while still maintaining its adhesive property.

In some embodiments, thermoplastic adhesives remain chemically stable and heat resistant after curing, making them suitable for use in microfluidic devices.

In any of the preceding embodiments, the bonding or sealing may be automated or manually performed.

In any of the preceding embodiments, the vacuuming process can not only improve the stability of the chip after packaging, but also avoid air bubbles between the bonded surfaces of the microfluidic chip layers. This way, there is no leakage in the process of high temperature heating reaction. In another aspect, the aesthetic appearance of the microfluidic chips are provided and maintained.

In any of the preceding embodiments, the pressing step can be implemented after the chip layer assembly is placed into a package such as a bag. This way, the surface of the chip can be protected by the package in subsequent steps, for example, scratching of the chip surface during subsequent pressing. At the same time, the scope of application of production line of the chip is expanded. In other words, the chips already placed in a bag can be pressed under normal conditions, with the same chip cleanness expected in a sterilized clean room. If the chips are not placed in a bag, they typically must be pressed in the clean room.

In any of the preceding embodiments, when the chip layers are bonded, the process of packing and sealing the finished chip can also be completed at the same time. Therefore, the process is simple, saves both time and labor, and it can realize low-cost and mass production of microfluidic chips.

In any of the preceding embodiments, the shape of the substrate and the cover slice can be the same or different, and can be round, circular, elliptical, oval, square, rectangular, triangular, annular, fan-shaped, or of an irregular shape.

In any of the preceding embodiments, the substrate and/or the cover slice can comprise an adhesive on one surface or both surfaces. Alternatively, in some embodiments, neither surface of the substrate comprises an adhesive; instead, the adhesive is provided on a cover slice or as a separate adhesive sheet which can be a single-sided adhesive sheet or a double-sided adhesive sheet. In some embodiments, neither surface of the cover slice comprises an adhesive; instead, the adhesive is provided on a substrate or as a separate adhesive sheet which can be a single-sided adhesive sheet or a double-sided adhesive sheet. In some embodiments, neither surface of the cover slice and the substrate comprises an adhesive; instead, the adhesive is provided as a separate adhesive sheet which can be a single-sided adhesive sheet or a double-sided adhesive sheet.

In any of the preceding embodiments, the substrate and/or the cover slice can comprise a structure (e.g., a microstructure such as a micro-channel) on one surface or both surfaces. Alternatively, in some embodiments, neither surface of the substrate comprises a structure (e.g., a microstructure such as a micro-channel). Instead, the structure is provided on a cover slice or using one or more separate sheets of material, which for example may form a microstructure (such as a micro-channel) once assembled between the substrate and the cover slice. In some embodiments, neither surface of the cover slice comprises a structure (e.g., a micro-structure such as a micro-channel). Instead, the structure is provided on a substrate or using one or more separate sheets of material, which for example may form a microstructure (such as a micro-channel) once assembled between the substrate and the cover slice. In some embodiments, neither surface of the cover slice and the substrate comprises a structure (e.g., a micro-structure such as a micro-channel); instead, the structure is provided as one or more separate sheets of material, which for example may form a microstructure (such as a micro-channel) once assembled between the substrate and the cover slice.

In any of the preceding embodiments, the substrate and/or the cover slice of the chip can have no through holes, or one or more through holes.

In any of the preceding embodiments, the chip can comprise one or more substrates and/or one or more cover slices.

In any of the preceding embodiments, the one or more substrates, the one or more single-sided adhesives, the one or more double-sided adhesives, and/or the one or more cover slices of the chip may, according to design needs, be combined together to form a single-layer, a two-layer, or a multi-layer chip comprising at least three layers, wherein for example each layer may comprise a set of micro-channels or chambers for a particular reaction of the multiple reactions performed in the chip. The multiple-layer chips may be used for control of multiple groups of liquid channels.

Figure 1A:
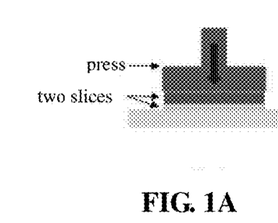
Figure 1B:
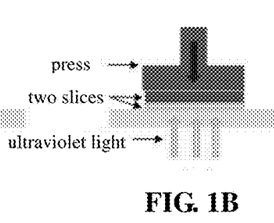
Figure 1C:
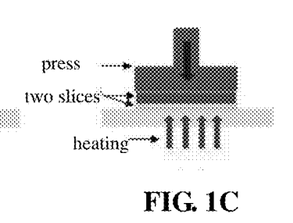

Referring to the drawings, FIGS. 1A-C are schematic diagrams showing one slice coated with a double-sided adhesive is bonded with the other slice. In FIG. 1A, if the double-sided adhesive is sensitive to pressure, the slice coated with the adhesive is aligned with the other slice, and then they are placed in a bag and vacuumed, and the packaged assembly is pressed after a vacuum is created in the package, in order to achieve a close bonding between the two slices. In FIG. 1B, if the double-sided adhesive is sensitive to light such as UV light, the slice coated with the adhesive is aligned with the other slice, and then they are placed in a bag and vacuumed, and the packaged assembly is pressed after a vacuum is created in the package. Finally, the assembly is exposed to ultraviolet light so as to achieve a close bonding between the two slices. In FIG. 1C, if the double-sided adhesive is sensitive to temperature, the slice coated with adhesive is aligned with the other slice, and then they are placed in a bag and vacuumed, and the packaged assembly is pressed after a vacuum is created in the package. Finally, the assembly is heated to an optimal temperature for bonding so as to achieve a close bonding between the two slices.

Figure 2A:
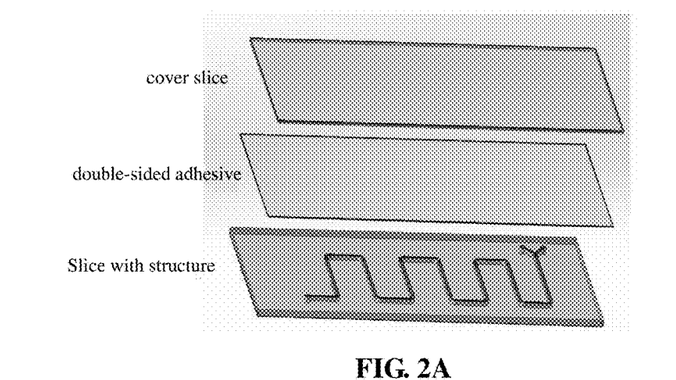
FIG. 2A is a detailed schematic diagram showing the packaging process for bonding two layers, for example, using a double-sided adhesive slice in between the two layers, according to one aspect of the present disclosure.

FIG. 2A is a schematic diagram showing a process for bonding two layers—a substrate and a cover slice. In this example, a dedicated processing technology is employed to fabricate one or more microstructures (such as a micro-channel) on the upper surface of a plastic slice. Through holes are provided on the lower surface of the plastic slice, at positions that correspond to the sample input and/or output positions of the microstructure. A cover slice can be coated with a double-sided adhesive, and the assembly is then aligned and bonded with the plastic slice (i.e., a substrate) comprising the micro-structure. After that, the chip is placed in a packaging bag, vacuumed, and pressed in order to provide a secure bonding of the chip layers. This way, the process of packaging a chip comprising two layers of slices is completed. In this example, the double-sided adhesive may be pre-applied to one surface of the cover slice or one surface of the substrate, or the three slices (i.e., the substrate, the double-sided adhesive sheet, and the cover slice) can be aligned and pressed in one step without either pre-application.

Figure 2B:
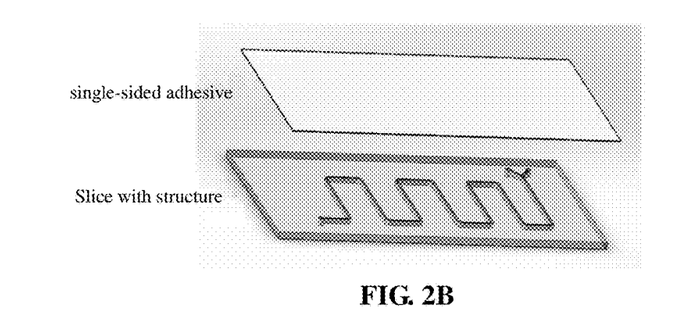
FIG. 2B is a detailed schematic diagram showing the packaging process for bonding a layer with a single-sided adhesive slice, according to one aspect of the present disclosure.

FIG. 2B is a schematic diagram showing a packaging process for bonding slices with a single-sided adhesive. In this example, a dedicated processing technology is employed to fabricate one or more microstructures (such as a micro-channel) on the upper surface of a plastic slice. Through holes are provided on the lower surface of the plastic slice, at positions that correspond to the sample input and/or output positions of the microstructure. Then, a single-sided adhesive sheet is aligned and applied to the plastic slice (i.e., a substrate). After that, the assembly is placed in a packaging bag, vacuumed, and pressed in order to provide a secure bonding of the adhesive sheet to the plastic slice. This way, the process of packaging a chip with a single-side adhesive is completed.

In one aspect, provided herein is a method for making and/or packaging a chip that is capable of producing chips with microstructures (such as a micro-channel) with high fidelity with regard to the designed shape and/or dimension. When the method is used for mass production of low-cost microfluidic chips, uniformity between the chips in the same batch and between batches can also be improved, e.g., for quality control purposes. In another aspect, using a solid adhesive and/or bonding and/or pressing the chip layers in a vacuum reduces and/or prevents bubble formation between the layers and/or within the microstructures of the chip. In yet another aspect, the aesthetic appearance of finished chips is preserved. In one aspect, the present method provides a chip with high strength bonding between layers, and the method prevents and/or reduces leakage of sample and/or reagent during sample/reagent application, reaction, and/or heating. In one aspect, provided herein is a simple manufacturing and/or packaging process which can realize low-cost and mass production of a chip. In some aspects, the chips packaged by the presently disclosed method can be applied to a variety of purposes like sample treatment, liquid control, nucleic acid extraction, and amplification reaction, a biochemical or immune reaction, a chemical synthesis and analysis, etc.

The following embodiments are employed to further describe the present disclosure, but not to limit the present disclosure. Unless otherwise stated, the method described uses normal raw materials that are commercially available.

Figure 3A:
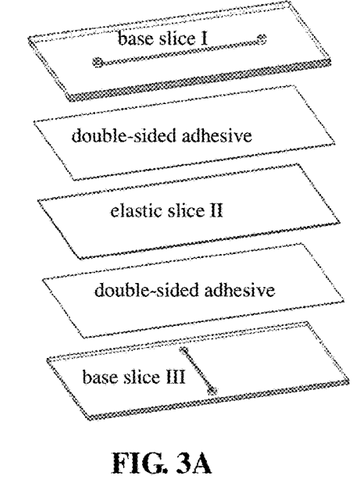
FIG. 3A is a detailed schematic diagram showing a chip comprising multiple layers, such as a first base slice (I), an elastic slice (II), a second base slice (III), a first double-sided adhesive slice between I and II, and a second double-sided adhesive slice between II and III.
Figure 3B:
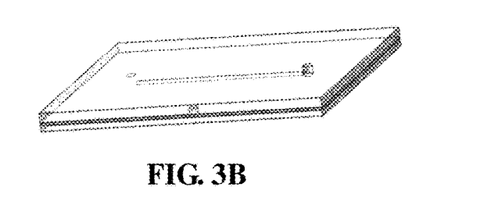
Figure 3C:
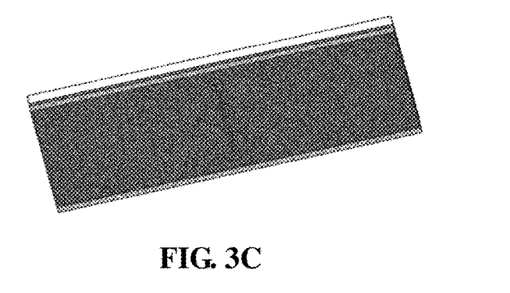
FIG. 3C is a bottom view of the multiple layers of the chip.

FIGS. 3A-C are diagrams showing a method for bonding multiple layers of slices into a chip. In one aspect, a milling cutter is employed to cut the lower surface of substrate I and the upper surface of substrate III of the microfluidic chip into the microstructures as shown in the figure. In another aspect, a perforator is used to make through-holes on the positions of substrate I and substrate III that correspond to the sample input and output holes of the microstructures. In one aspect, the elastic slice II of which both sides are coated with double-side adhesive is applied to seal the micro-channels and the holes of substrate I and substrate III. In a further aspect, the bonded chip is placed into a packaging bag, and a vacuum pump is used to create a vacuum. In one aspect, the sealed package is substantially free of any air or gas. When used herein, "substantially free of any air or gas" includes that the volume of air or gas in the sealed package accounts for less than about 0.000001%, less than about 0.00001%, less than about 0.0001%, less than about 0.001%, less than about 0.01%, less than about 0.1%, less than about 1%, less than about 5%, or less than about 10% of the total volume of the packaged content. In another aspect, the packaged assembly is placed onto a pneumatic punching machine to press the assembly in the bag for about 1 minute, 2 minutes, 5 minutes, 10 minutes, or more than about 10 minutes, so that the three layers of slices are closely bonded and a packaged and finished chip product is obtained.

Shown in FIG. 3A are multiple layers to be bonded into a chip using a method disclosed herein. FIG. 3B provides a top view of the multiple layers bonded into a chip, in which the micro-channel in slice I and the micro-channel in slice III are located in different layers of the chip. FIG. 3C provides a bottom view of the multiple layers bonded into a chip. Thus, the presently disclosed method can be used for packaging multiple layers into a chip, and different microfluidic channels or sets of microfluidic channels can be formed in the same layer or in at least two different layers.

Figure 4A:
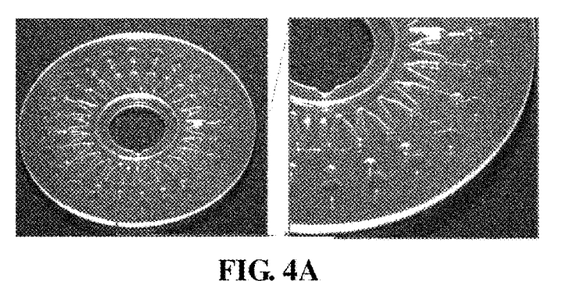
FIG. 4A shows an actual chip which was made by heating at 65° C. for 60 minutes using a method according to one aspect of the present disclosure. In comparison.
Figure 4B:
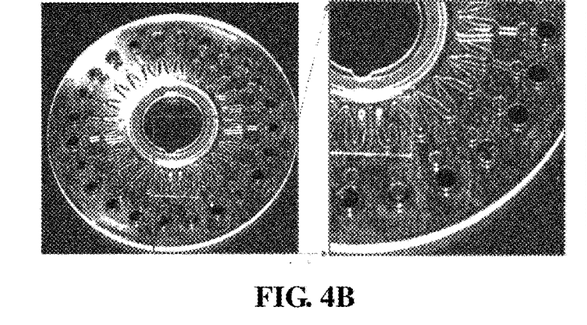
FIG. 4B shows an actual chip which was made by heating at 65° C. for 60 minutes using a double-sided adhesive and a conventional method.
Figure 4C:
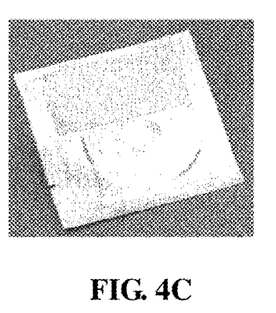
FIG. 4C shows an actual chip and its packaging, which were made by synchronized or simultaneous bonding of the slices and packaging of the resultant chip, according to one aspect of the present disclosure.

In any of the preceding embodiments, the substrate and the cover slice may be in a variety of shapes, for example, as shown in FIGS. 4A-C. For example, WO 2015/131662 A1 discloses a microfluidic chip, which may be manufactured and/or packaged using a method disclosed herein. In one aspect, a double-sided adhesive is applied to the lower surface of the cover slice. In another aspect, the cover slice with the double-sided adhesive is aligned with the surface of the substrate comprising a microstructure (such as the wave-shaped microstructures as shown in FIG. 4A), and is used to seal the microstructure. In one aspect, the assembly is then placed into a bag for packaging. In another aspect, the packaged assembly is provided with a vacuum around the bonded layers, for example, by vacuum-pumping the package. In another aspect, the package (with the chip layers inside) is placed onto a punching machine to press it, for example, under around 0.7 MPa and for about 1 minute, so that the substrate and the cover slice of the microfluidic chip are closely bonded with each other. FIG. 4A shows an actual chip manufactured by a method disclosed herein. A colored solution was added into the chip, which was then centrifuged. The chip was then heated at about 70° C. for about 60 minutes. FIG. 4A shows that even after being heated under high temperature for a long time, the chip fabricated by a method of the present disclosure had no air bubble at the bonding interface, and the micro-channels remained firmly sealed without any leakage. Thus, the presently disclosed method can not only ensure the aesthetic appearance of the microfluidic chip, but also protect the bonding interface from leakage.

A chip made using a conventional approach was shown in FIG. 4B and tested as a comparison. If the double-sided adhesive is used for bonding the substrate and the cover slice using a conventional packaging method, e.g., the conventional method does not vacuum the package before pressing, the chip would typically have air bubbles and/or leakage. A colored solution was added into the conventionally made chip, which was then centrifuged. The chip was then heated at about 70° C. for about 60 minutes. As shown in FIG. 4B, there are many air bubbles in the heated conventionally made chip. Some conventionally made chips are subject to local leakage because of loose bonding.

FIG. 4C shows an actual chip simultaneously bonded and packaged by a method disclosed herein, with the chip enclosed in an external packaging bag. In this example, an aluminum foil bag was used for sealing the chip layer assembly, in which package the assembly was pressed and the layers were bonded. In one aspect, the packaging of the chip can meet the needs of some test fields, such as that the chip should be free from light, sealed, and can be stored for a long time.

Additional embodiments are provided below to further illustrate the present disclosure.

Embodiment 1

A method for making and/or packaging a chip, comprising:
1) aligning a substrate and a cover slice and providing a double-sided adhesive between the substrate and the cover slice, or providing a single-sided adhesive directly on a substrate with the adhesive side facing the substrate, in order to obtain an assembly;
2) placing the assembly into a package, and applying a pressure to the assembly to bond the substrate/adhesive/cover slice or the substrate/adhesive after creating a vacuum in the package, e.g., by using vacuum pumping, thereby completing the packaging of the chip in order to obtain a bonded and packaged chip.

Embodiment 2

The method of Embodiment 1, wherein the chip is a microfluidic chip.

Embodiment 3

The method of Embodiment 1 or 2, wherein the substrate and/or the cover slice of the chip comprises a material selected from the group consisting of a resin, a plastic, a silicone rubber, a glass, a ceramic, silicon, and a metal, and any combination thereof, wherein the plastic is optionally selected from the group consisting of PMMA, PC, COC, PET, and COP, and any combination thereof.

Embodiment 4

The method of any one of Embodiments 1-3, wherein the double-sided adhesive and/or the single-sided adhesive comprise a viscous or sticky material; or wherein the double-sided adhesive and/or the single-sided adhesive comprise one or more of a pressure sensitive material, a temperature sensitive material, and a light sensitive material; or wherein the double-sided adhesive and/or the single-sided adhesive comprise one or more of a transparent material, a semi-transparent material, and a non-transparent material.

Embodiment 5

The method of any one of Embodiments 1-4, wherein one or more steps of the method are automated or manually performed.

Embodiment 6

The method of any one of Embodiments 1-5, wherein the method further comprises after or at about the same time as applying the pressure to the assembly, a step of exposing the package to heat or light.

Embodiment 7

The method of any one of Embodiments 1-6, wherein the shape of the substrate and/or the cover slice of the chip is the same or different, and/or is round, rectangular, annular, or fan-shaped.

Embodiment 8

The method of any one of Embodiments 1-7, wherein the chip comprises one or more substrates.

The invention claimed is:
1. A method of manufacturing a packaged chip, comprising:
1) aligning a first layer and a second layer to obtain an assembly of the first and second layers, wherein an adhesive interface is provided between the first and second layers;
2) placing the assembly in a package;
3) removing air or gas from the package; and
4) applying a pressure on the packaged assembly to bond the first and the second layers into a chip, thereby obtaining a packaged chip, wherein the chip is a microfluidic chip.

2. The method of claim 1, wherein the chip is a biochip.

3. The method of claim 1, wherein the first layer is a substrate of the chip and the second layer is a cover of the chip, and the adhesive interface comprises a double-sided adhesive sheet, or
wherein the first layer is a substrate of the chip and the second layer comprises an adhesive surface facing and/or contacting the substrate.

4. The method of claim 1, wherein air or gas from the package is removed to create a vacuum in the package.

5. The method of claim 1, wherein at least about 80%, at least about 90%, at least about 95%, at least about 99%, at least about 99.9%, or at least about 99.99% of air or gas in the package is removed.

6. The method of claim 1, wherein after the air or gas removal, there is less than about 10% (v/v), less than about 5% (v/v), less than about 1% (v/v), less than about 0.1% (v/v), less than about 0.01% (v/v), or less than about 0.001% (v/v) of air or gas in the packaged volume.

7. The method of claim 1, wherein the packaged assembly is treated in step 4), and the treatment of the packaged assembly comprises heating and/or exposing the packaged assembly to a light.

8. The method of claim 1, wherein the adhesive interface comprises a pressure sensitive adhesive material, a temperature sensitive adhesive material, and/or a light sensitive adhesive material.

9. The method of claim 1, wherein the packaged assembly is treated in step 4), and the pressure is applied on the packaged assembly at the same time as the treatment of the packaged assembly.

10. The method of claim 1, wherein the packaged assembly is treated in step 4), and the pressure is applied prior to the treatment of the packaged assembly.

11. The method of claim 1, wherein the first layer, the second layer, and/or the packaging comprises a material selected from the group consisting of a resin, a plastic, a silicone rubber, a glass, a ceramic, silicon, a metal, and any combination thereof.

12. The method of claim 1, wherein the first layer, the second layer, and/or the packaging comprises a transparent material, a semi-transparent material, and/or a non-transparent material.

13. The method of claim 1, wherein the packaging comprises a plastic and/or an aluminum foil.

14. The method of claim 1, wherein one or more steps of the method are automated or manually performed.

15. The method of claim 1, wherein the shape of the first and the second layers of the chip is the same or different.

16. The method of claim 1, wherein the shape of the first and/or the second layers of the chip is round, rectangular, annular, or fan-shaped.

17. The method of claim 1, further comprising handling, shipping, or storing the packaged chip without the need of cleaning or sterilizing the chip.

18. A packaged chip manufactured by the method of claim 1.

19. The method of claim 1, further comprising treating the packaged assembly.

20. A method of manufacturing a packaged chip, comprising:
1) aligning a first layer and a second layer to obtain an assembly of the first and second layers, wherein an adhesive interface is provided between the first and second layers;
2) placing the assembly in a package;
3) removing air or gas from the package; and
4) applying a pressure on the packaged assembly to bond the first and the second layers into a chip and exposing the packaged assembly to a light,
thereby obtaining a packaged chip, wherein the light comprises a UV light.

21. A method of manufacturing a packaged chip, comprising:
1) aligning a first layer and a second layer to obtain an assembly of the first and second layers, wherein an adhesive interface is provided between the first and second layers;
2) placing the assembly in a package;
3) removing air or gas from the package; and
4) applying a pressure on the packaged assembly to bond the first and the second layers into a chip,
thereby obtaining a packaged chip,
wherein the chip comprises at least two first layers; and/or at least two second layers; and/or two first layers and one second layers, wherein the second layer has two surfaces each contacting one of the first layers via a double-sided adhesive sheet.

* * * * *